United States Patent
Ficke et al.

(10) Patent No.: US 8,686,782 B2
(45) Date of Patent: Apr. 1, 2014

(54) STRUCTURE FOR A FREQUENCY ADAPTIVE LEVEL SHIFTER CIRCUIT

(75) Inventors: Joel Thomas Ficke, Madison, WI (US); David Michael Friend, Rochester, MN (US); Grant Paul Kesselring, Rochester, MN (US); James David Strom, Rochester, MN (US); Jianguo Yao, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 95 days.

(21) Appl. No.: 12/956,343

(22) Filed: Nov. 30, 2010

(65) Prior Publication Data

US 2012/0133413 A1    May 31, 2012

(51) Int. Cl.
*H03L 5/00*    (2006.01)

(52) U.S. Cl.
USPC ............. 327/333; 327/156; 327/147; 326/62; 326/81

(58) Field of Classification Search
USPC ............. 327/147–161, 306, 333; 326/62–63, 326/80–81
See application file for complete search history.

(56) References Cited

U.S. PATENT DOCUMENTS

| | | | |
|---|---|---|---|
| 5,473,640 A * | 12/1995 | Bortolini et al. | 375/376 |
| 5,491,441 A | 2/1996 | Goetschel et al. | |
| 2010/0176887 A1 * | 7/2010 | Wu | 331/15 |

* cited by examiner

*Primary Examiner* — Dinh T. Le
(74) *Attorney, Agent, or Firm* — Stachler Intellectual Property Law LLC

(57) ABSTRACT

The present invention provides an apparatus and method for a frequency adaptive level shifter circuit. The frequency adaptive level shifter circuit includes a first inverter, a second inverter coupled to the output of the first inverter, a capacitor coupled to the output of the second inverter, and a resistor coupled to the output of the capacitor. The frequency adaptive level shifter circuit further includes a transistor coupled to the output of the resistor, wherein the transistor has a gate connected to a reference voltage, a third inverter coupled to the output of the capacitor, and a fourth inverter coupled to the output of the third inverter and the transistor and outputting the signal.

9 Claims, 7 Drawing Sheets

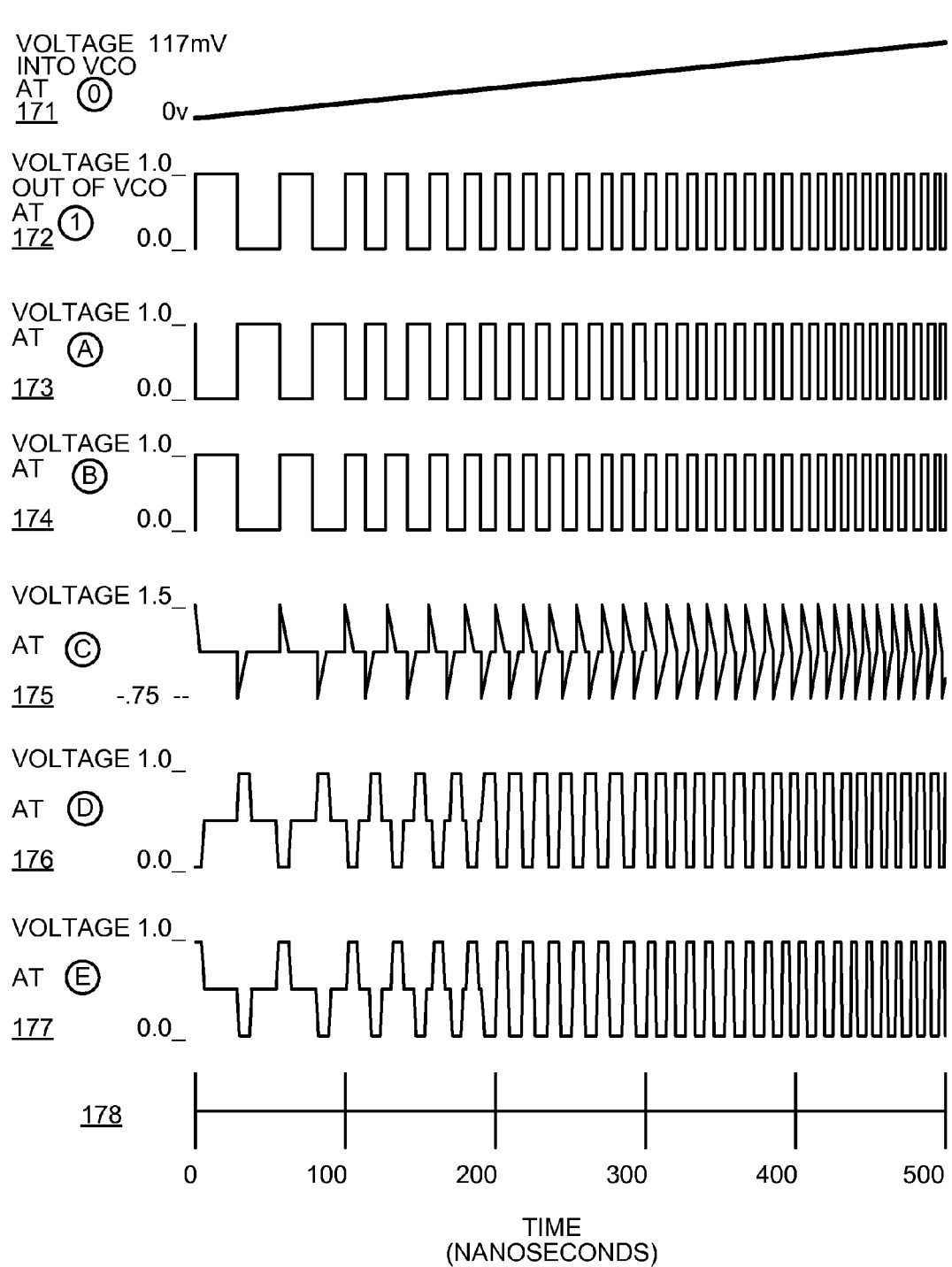

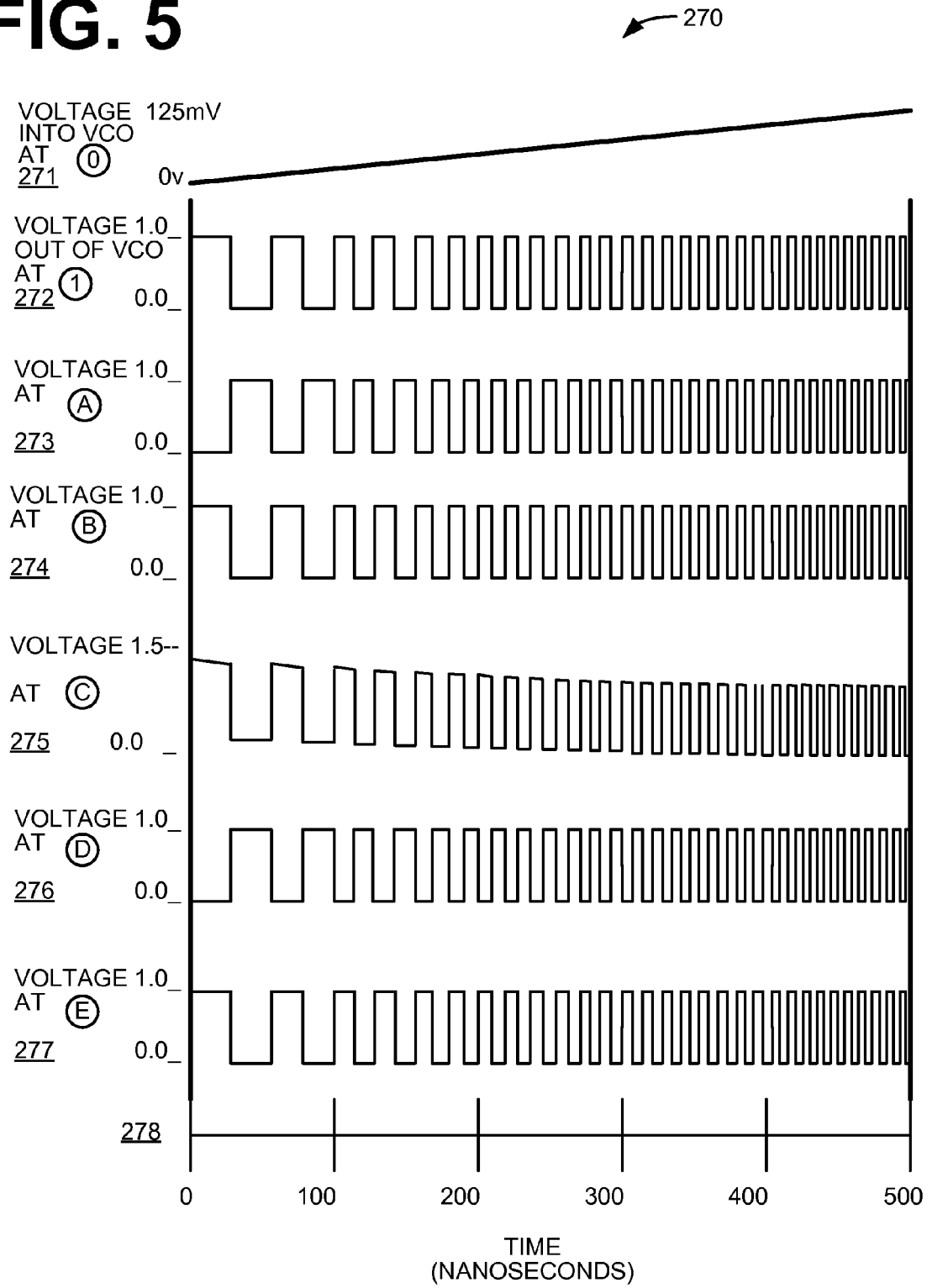

STRUCTURE FOR A FREQUENCY ADAPTIVE LEVEL SHIFTER CIRCUIT

BACKGROUND OF THE INVENTION

1. Field of the Invention

The present invention generally relates to a design structure for phase-locked loop circuit, and in particular a frequency adaptive level shifter circuit.

2. Description of Background

Currently, level translator circuits are used to pass signals across voltage domain boundaries. Many different level translators exist in the prior art, but many of the traditional circuit topologies are becoming unworkable as supply voltages decrease and the frequency of the signals increase.

A specific translator architecture that is not as limited by voltage headroom or signal frequency is described in the commonly assigned U.S. Pat. No. 5,491,441, entitled "Method and apparatus for generating a clock signal from a continuous oscillator signal including a translator circuit", Ser. No. 08/269,197, issued on Feb. 13, 1996. It is understood that other means exist to establish a level translator circuit.

The intended use of the circuit described in this patent was to translate small voltage continuous signals into large full supply signals. It also functions well as a general purpose level-shifter that passes CMOS signals across a voltage domain boundary. A time constant, determined by the capacitor and resistor, are tuned for a specific frequency of application. A limitation with this is that the fixed RC product formed by a resistor and capacitor unduly limits the range of frequencies that the circuit is useful over.

SUMMARY OF THE INVENTION

Embodiments of the present invention provide an apparatus and method for a frequency adaptive level shifter circuit. Briefly described, in architecture, one embodiment of the system, among others, can be implemented as follows.

The frequency adaptive level shifter circuit includes a first inverter, a second inverter coupled to the output of the first inverter, a capacitor coupled to the output of the second inverter and a resistor coupled to the output of the capacitor. The frequency adaptive level shifter circuit further includes a transistor coupled to the output of the resistor, wherein the transistor has a gate connected to a reference voltage, a third inverter coupled to the output of the capacitor and a fourth inverter coupled to the output of the third inverter and the transistor and outputting the signal.

The frequency adaptive level shifter circuit can be included in a phase-lock loop device that generates a frequency adaptive clock signal across voltage domain boundaries. The phase-lock loop device includes a low pass filter and a voltage controlled oscillator that receives a reference voltage from the low pass filter. The phase-lock loop device further includes a level shifter that receives a signal from the voltage controlled oscillator and the reference voltage and outputs the frequency adaptive clock signal, wherein a transistor enables the level shifter to be frequency adaptive. The phase-lock loop device further includes a multiplexer for selecting a PLL output signal between the reference clock and the frequency adaptive clock signal.

The frequency adaptive level shifter circuit can be included in a processor device. The processor device including a memory containing data, a shared data bus and a processor. The processor device further including a phase-lock loop circuitry configured to enable high-speed frequency adaptive level shifting across voltage domain boundaries.

Embodiment of the present invention can also be viewed as providing for generating a high-speed frequency adaptive clock signal across voltage domain boundaries. In this regard, one embodiment of such a method, among others, can be broadly summarized by the following steps. The method includes AC coupling a voltage signal to an input of a first inverter, and driving a second inverter with an output of said first inverter. The method further includes supplying a feedback signal from said output to said input of said first inverter, and providing a feedback resistor in series with a transistor, between said output and said input of said first inverter, wherein a gate of said transistor is controlled by a reference voltage.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the embodiment of the present invention is particularly pointed out and distinctly claimed in the claims at the conclusion of the specification. The foregoing and other objects, features, and advantages of the invention are apparent from the following detailed description taken in conjunction with the accompanying drawings in which:

FIG. 3 is a timing diagram depicting examples of the operation of a phase-lock loop (PLL) circuit using an level shifter according to prior art.

FIG. 5 is a timing diagram depicting examples of the operation of a phase-lock loop (PLL) circuit utilizing a frequency adaptive level shifter according to one embodiment of the invention.

The detailed description explains the preferred embodiments of the invention, together with advantages and features, by way of example with reference to the drawings.

DETAILED DESCRIPTION OF THE INVENTION

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether a particular advantage is achieved by a given embodiment is not limiting of the invention. Thus, the following aspects, features, embodiments and advantages are merely illustrative and are not considered elements or limitations of the appended claims except where explicitly recited in the claim(s). Likewise, reference to "the invention" shall not be construed as a generalization of any inventive subject matter disclosed herein and shall not be considered to be an element or limitation of the appended claims except where explicitly recited in a claim(s).

One embodiment of the present invention addresses the limitation with the prior art with the fixed RC (i.e. resistor-capacitor) product formed by R and C that limits the range of frequencies over which the circuit is useful. One embodiment of the present invention accomplishes this by making the RC product inside the level shifter adaptable to the frequency. At low frequencies of operation, the RC product is higher while at high frequencies of operation, the RC product is lower. This provides for an alternating current (i.e. AC) coupled level shifter that is improved to pass a wide range of frequencies.

While described below with respect to a phase-lock loop (PLL) circuit, embodiments of the invention may be utilized with any circuit which utilizes a high-speed level shifting circuit across domain boundaries. In general, embodiments of the invention may be utilized with any level shifting circuit and are not limited to any specific configuration.

Embodiments of the invention may be utilized to enable high-speed level shifting across domain boundaries. As used herein, a high-speed level shifting across domain boundaries circuit maybe included in a mainframe, server, personal computer, internet appliance, digital media appliance, portable digital assistant (PDA), portable music/video player, video game console and the like. Alternative embodiments of the invention may be utilized with network routing, graphic card and the like.

Figure 1:
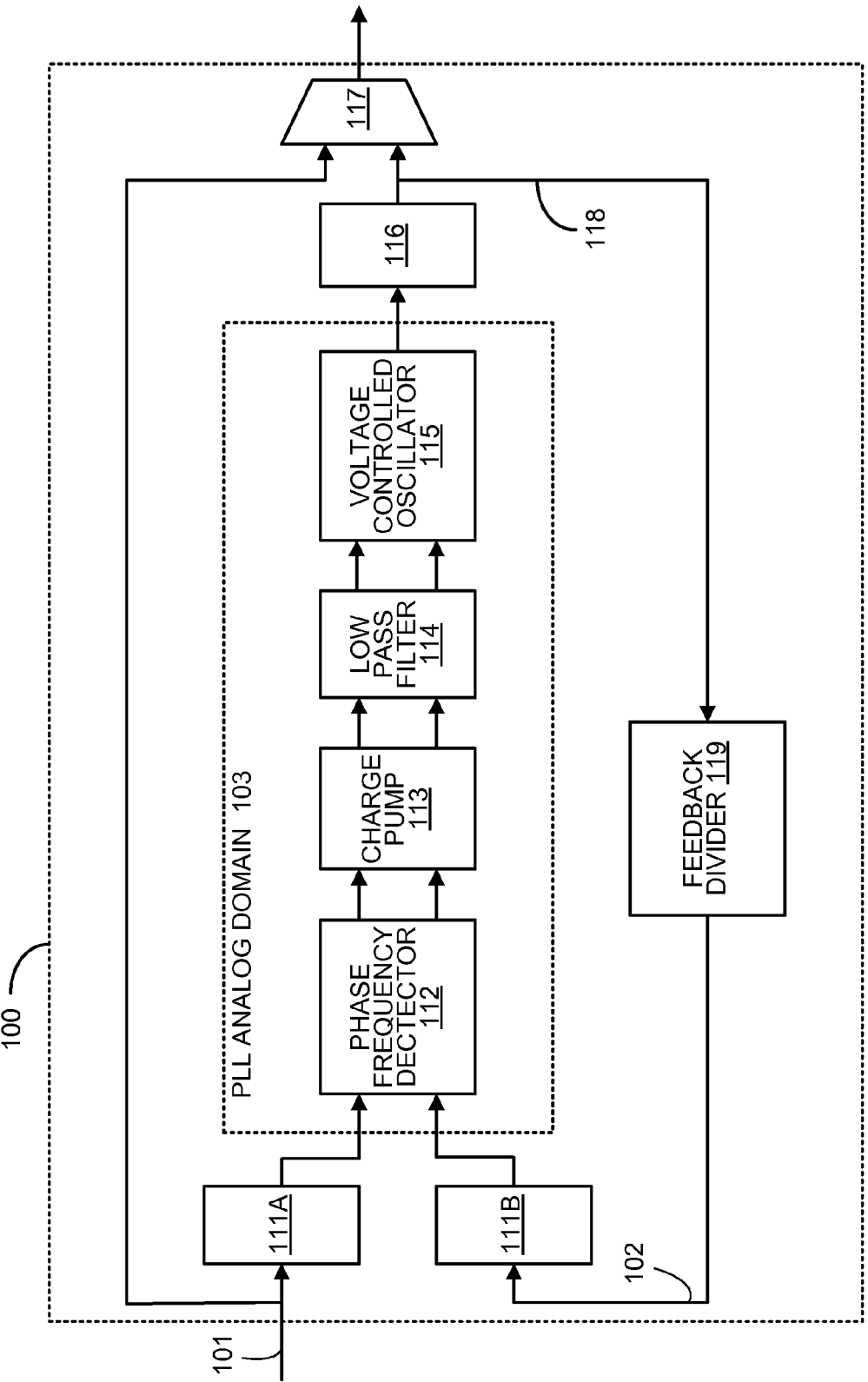
FIG. 1 is a block diagram depicting a phase-lock loop (PLL) circuit according to prior art.

FIG. 1 is a block diagram depicting a phase-lock loop (PLL) circuit 100 according to prior art. In an example PLL 100, level shifters 111A, 111B and 116 are used to pass clock signals 101 and 102 between the analog domain (i.e. components inside 103 that include a phase frequency detector 112, charge pump 113, low pass filter 114 and voltage controlled oscillator 115) and the digital domain (i.e. components outside 103 that include digital-to-analog level shifter 111A & 111B, level shifter output signal 118, digital feedback divider 119, multiplexer 117, etc). The level shifter 116 at the output of the voltage controlled oscillator (VCO) 115 is especially problematic because it must pass a very wide range of frequencies. When the VCO 115 is starting up it will produce very low frequencies in the Hz range. As the loop begins to lock the frequency will quickly rise into the GHz range. This level shifter 116 of the prior art will not work across such a wide range.

Figure 2:
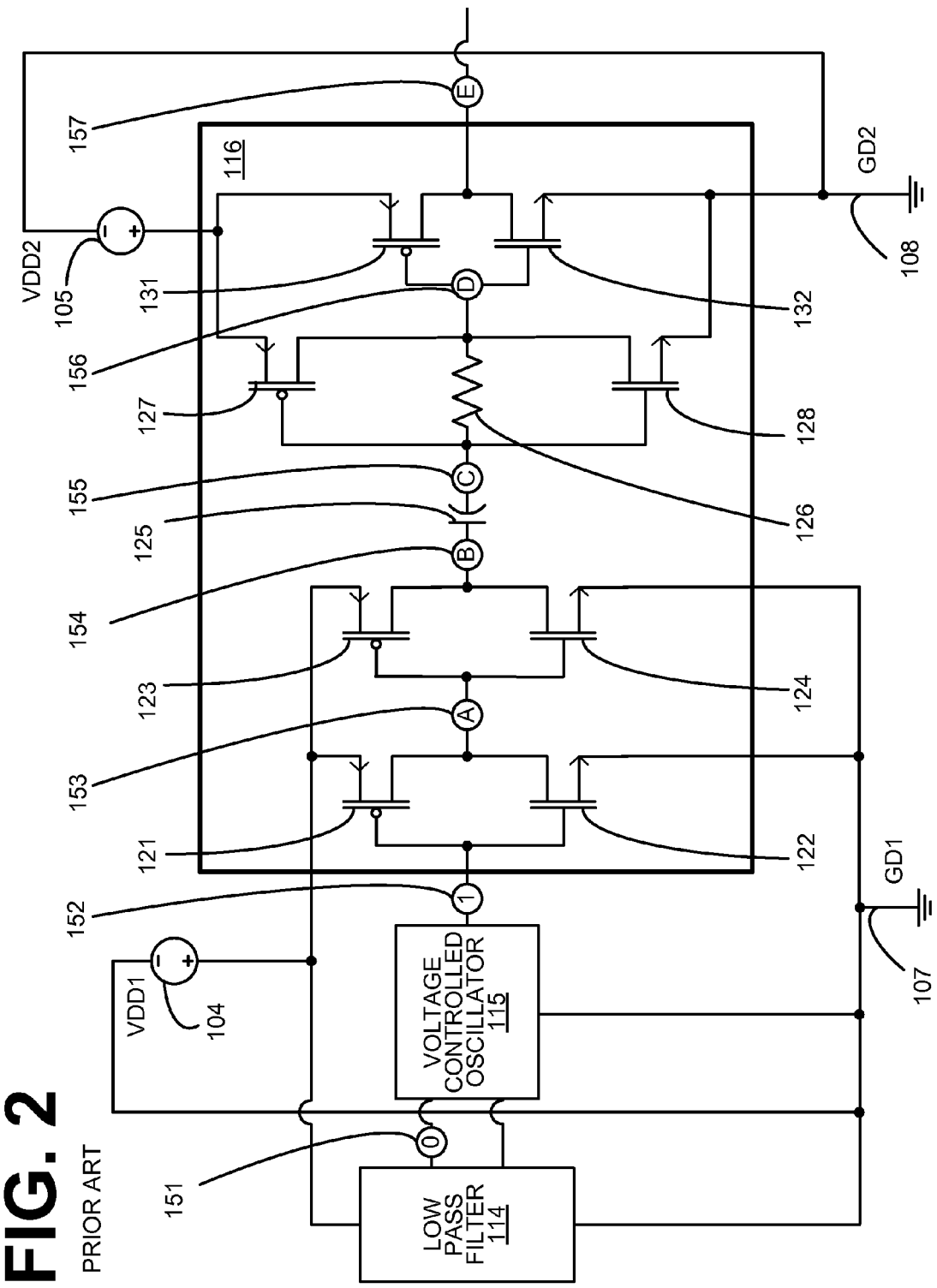
FIG. 2 is a block diagram depicting an example of the architecture of an analog-to-digital level shifter according to prior art.

FIG. 2 is a block diagram depicting an example of the architecture of level shifter 116 according to prior art. Shown is a VCO 115 with the level shifter 116 of the prior art connected in series with a differential voltage input to the VCO 115 ramping from 0 mV to 125 mV. Low frequencies (less than 100 MHz) get distorted when passing through the level shifter 116 because the feedback resistor 126 and capacitor 125 (i.e. RC) product is too small relative to the period of the signal as illustrated in FIG. 3 with regard to nodes C-E. Also, some of the internal nodes, for example voltage at node C 175 in FIG. 3, of level shifter 116 sees severe voltage peaks that pose device reliability concerns. As the VCO 115 ramps up from 0 mV to 125 mV, the clock frequency at node 1 152 eventually reaches a point that the level shifter 116 can properly pass the signal. The clock signal distortion at low frequency is problematic for the PLL 100 because it can cause failure to lock.

As shown, the level shifter 116 includes two voltage domains, the first domain powered by the VDD1 104 with ground1 107, and the second domain powered by the VDD2 105 with ground2 108. The level shifter 116 includes a first inverter that comprises pfet 121 and nfet 122 that are connected in series between supply voltage VDD1 104 and the ground1 107. The gate input of pfet 121 and nfet 122 is at node 1 152. The level shifter 116 further includes a second inverter electrically connected to the first inverter, where the second inverter comprises of pfet 123 and nfet 124 that are also connected in series between supply voltage VDD1 104 and the ground1 107. The gate input of pfet 123 and nfet 124 is at node A 153. The output of the pfet 123 and nfet 124 is node B 154, that is electrically connected to a capacitor 125.

The output of the capacitor 125 is node C 155, that is electrically connected to a feedback resistor 126, and a third inverter that comprises pfet 127 and nfet 128. The pfet 127 and nfet 128 are also connected in series between the supply voltage VDD2 105 and the ground2 108. The output of the feedback resistor 126, the drain of pfet 127 and the drain of nfet 128, is node D 156. This is then electrically connected to pfet 131 and nfet 132 that are also connected in series between supply voltage VDD2 105 and the ground2 108. It is between node C 155 and node D 156, that the signal passes across voltage domain boundaries (i.e. from voltage domain VDD1 to voltage domain VDD2). The pfet 131 and nfet 132 act as a fourth inverter. The output signal of the fourth inverter is measured at node E 157.

FIG. 3 shows timing diagrams of the operation of a phase-lock loop (PLL) circuit 100 using a level shifter 116 according to prior art. As shown, the voltage input 171 to the VCO at node 0 151, from the low pass filter 114 increases from 0 mV to 125 mV on power up. It is at this time that the analog voltage changes dramatically and causes the VCO 115 to produce very low frequencies during power up. The signal 172 from the VCO 115 at node 1 152 reflects the frequency increasing as the voltage increases. As shown in 100 ns increments, the frequency goes from 2, 4, 6, 8 and then 10 cycles per 100 ns. The signal 173 at node A 153 reflects the exact inverse of the signal 172 output from VCO 115 at node 1 152. This is to be expected since the first inverter comprises pfet 121 and nfet 122. The second inverter comprises pfet 123 and nfet 124, which converts the signal as shown with regard to the signal 174 at node B 154.

The output of the second inverter is connected to capacitor 125. The signal output from the capacitor 125 is shown with regard to the signal 175 at node C 155. This signal 175 is greatly distorted, because of the very low frequencies from the VCO 115 at startup. Upon entering the feedback resistor 126 in parallel with a third inverter, comprising pfet 127 and nfet 128, the signal is marginally corrected as shown with regard to the signal 176 at node D 156. The output node D 156 connects to the gate of a fourth inverter comprising pfet 131 and nfet 132. The output signal 177 of the fourth inverter is measured at node E 157.

Figure 4A:
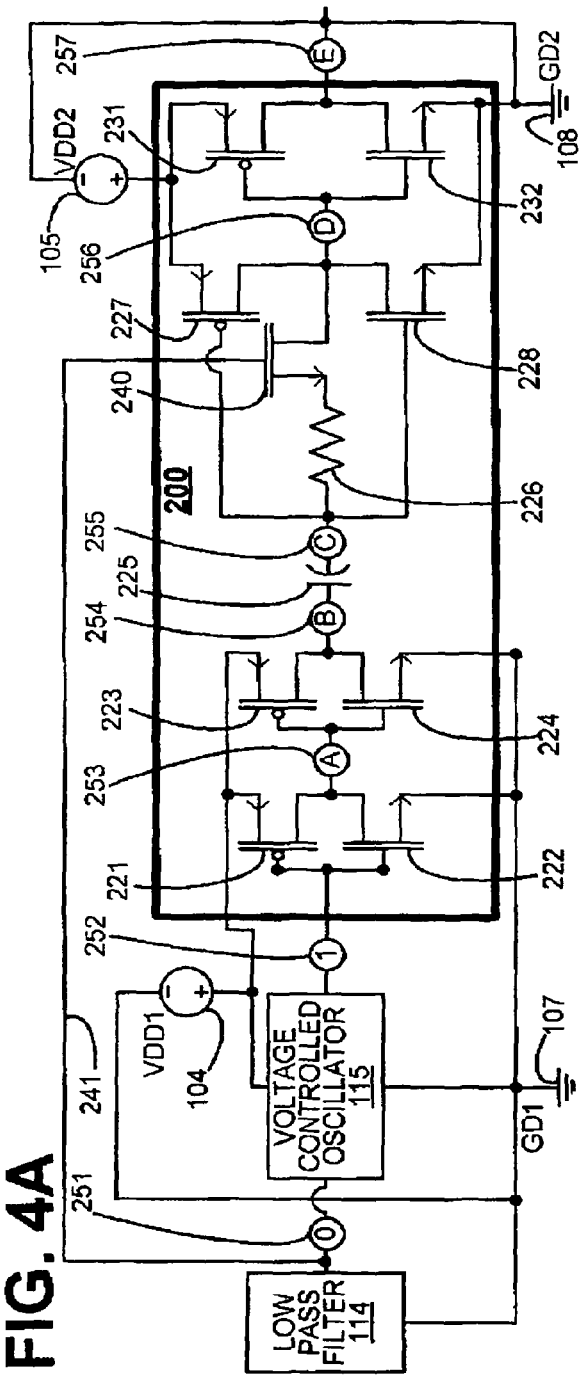
FIG. 4A is a block diagram depicting an example of the architecture of a frequency adaptive level shifter according to one embodiment of the invention, connected to a single ended VCO.
Figure 4B:
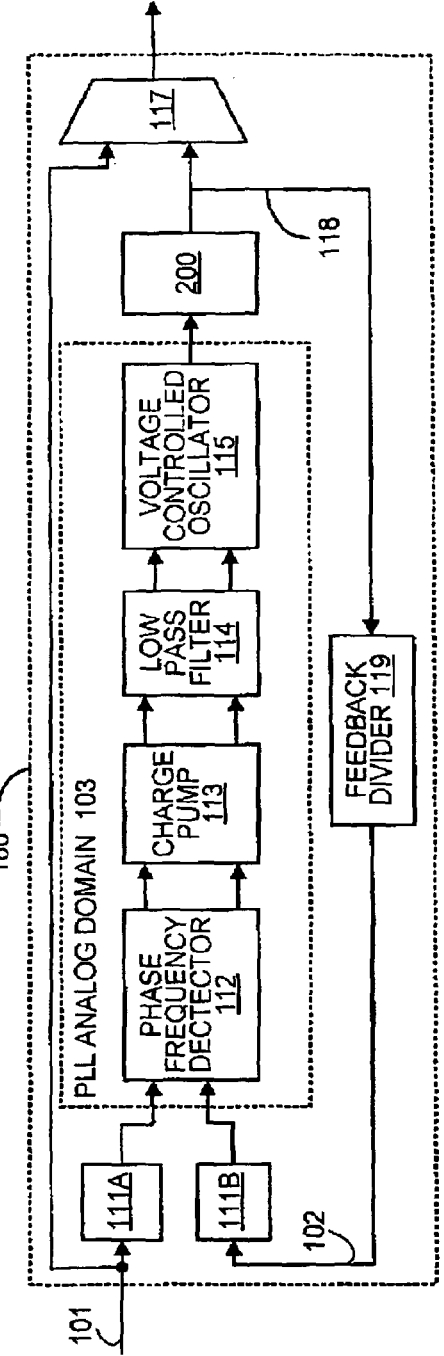
FIG. 4B is a block diagram depicting an example of the architecture of a phase-lock loop (PLL) circuit with the frequency adaptive level shifter in the place of the level shifter shown in the PLL in the prior art.

FIG. 4A is a block diagram depicting an example of the architecture of a frequency adaptive level shifter 200 according to one embodiment of the invention. FIG. 4B is a block diagram depicting an example of the architecture of a phase-lock loop (PLL) circuit 180 with frequency adaptive level shifter 200 in the place of level shifter 116 shown in PLL 100 (FIG. 1). The frequency adaptive level shifter 200 addresses the Problem of PLL 100 using level shifter 116 by making the RC product adaptive to the frequency of the signal to be passed. At low frequency input to the frequency adaptive level shifter 200, the RC product is higher and at high frequency input to the frequency adaptive level shifter 200, the RC product is lower. This function is acquired by adding an nfet 240 in series with the feedback resistor 226.

As shown, the frequency adaptive level shifter 200 includes a first inverter that comprises pfet 221 and nfet 222 that are connected in series between the supply voltage VDD1 104 and the ground1 107. The gate input of pfet 221 and nfet 222 is at node 1 252. The frequency adaptive level shifter 200 further includes a second inverter electrically connected to the first inverter, where the second inverter comprises of pfet 223 and nfet 224 that are also connected in series between those supply voltage VDD1 104 and the GD1 107. The gate input of pfet 223 and nfet 224 is at node A 253. The output of the pfet 223 and nfet 224 is node B 254, that is electrically connected to a capacitor 225.

The output of the capacitor 225 is node C 255, that is electrically connected to a feedback resistor 226 in parallel with a third inverter comprising pfet 227 and nfet 228 that are also connected in series between supply voltage VDD2 105 and the GD2 108. An nfet 240 is added in series with the feedback resistor 226. The gate node of the nfet 240 is connected via link 241 to the control voltage at node 0 251 of the VCO 115. At startup, the control voltage is forced to ground to avoid VCO 115 runaway. The low voltage on the gate of the nfet 240 makes the feedback resistance in the frequency adaptive level shifter 200 very high. As the PLL 180 begins the locking process, the VCO 115 control voltage rises which speeds up the VCO 115 and also turns on the nfet 240 causing the feedback resistance inside the frequency adaptive level shifter 200 to decrease. This has the effect of lowering the RC product of the frequency adaptive level shifter 200. When the control voltage exceeds the device threshold voltage, the nfet 240 goes into the saturation region and the resistance of the nfet 240 approaches zero, leaving just the discrete R to set the RC product.

The output of the feedback resistor 226 and nfet 240, and the third inverter is node D 256, that is electrically connected to pfet 231 and nfet 232 that are also connected in series between those supply voltage VDD2 105 and the ground2 108. The pfet 231 and nfet 232 act as a fourth inverter. The output signal of the third inverter is measured at node E 257.

In an alternative embodiment, the architecture of the frequency adaptive level shifter 200 according to one embodiment of the invention, is connected to a differential VCO using a single input.

FIG. 5 is a timing diagram depicting examples of the operation of a phase-lock loop (PLL) circuit 180 utilizing a frequency adaptive level shifter 200 according to one embodiment of the invention. With the improved design, the frequency adaptive level shifter 200 passes all frequencies without distortion.

As shown, the voltage input 271 to the VCO at node 0 251, from the charge pump 113 and low pass filter 114 increases from 0 mV to 125 mV on power up. It is at this time that the analog voltage changes dramatically and causes the VCO 115 to produce very low frequencies during power up. The signal 272 from the VCO 115 at node 1 252 reflects the frequency increasing as the voltage increases. As shown in 100 ns increments, the frequency goes from 2, 4, 6, 8 and 10 cycles per 100 ns. The signal 273 at node A 253 reflects the exact inverse of the signal 272 output from VCO 115 at node 1 252. This is to be expected since the first inverter comprises pfet 121 and nfet 122. The second inverter comprises pfet 123 and nfet 124, which converts the signal as shown with regard to the signal 274 at node B 254.

The output of the second inverter, i.e. signal 274, is connected to capacitor 225. The signal output 275 from the capacitor 225 is shown with regard to node C 255. This signal at node C 255 is only mildly distorted, because of the very low frequencies from the VCO 115. Upon entering the feedback resistor 226 in series with nfet 240, and in parallel with the third inverter comprising pfet 227 and nfet 228, the signal is corrected as shown with regard to the signal 276 at node D 256. The output node D 256, is connected to the fourth inverter comprising pfet 231 and nfet 232. The output signal 277 of the fourth inverter is measured at node E 257.

Figure 6:
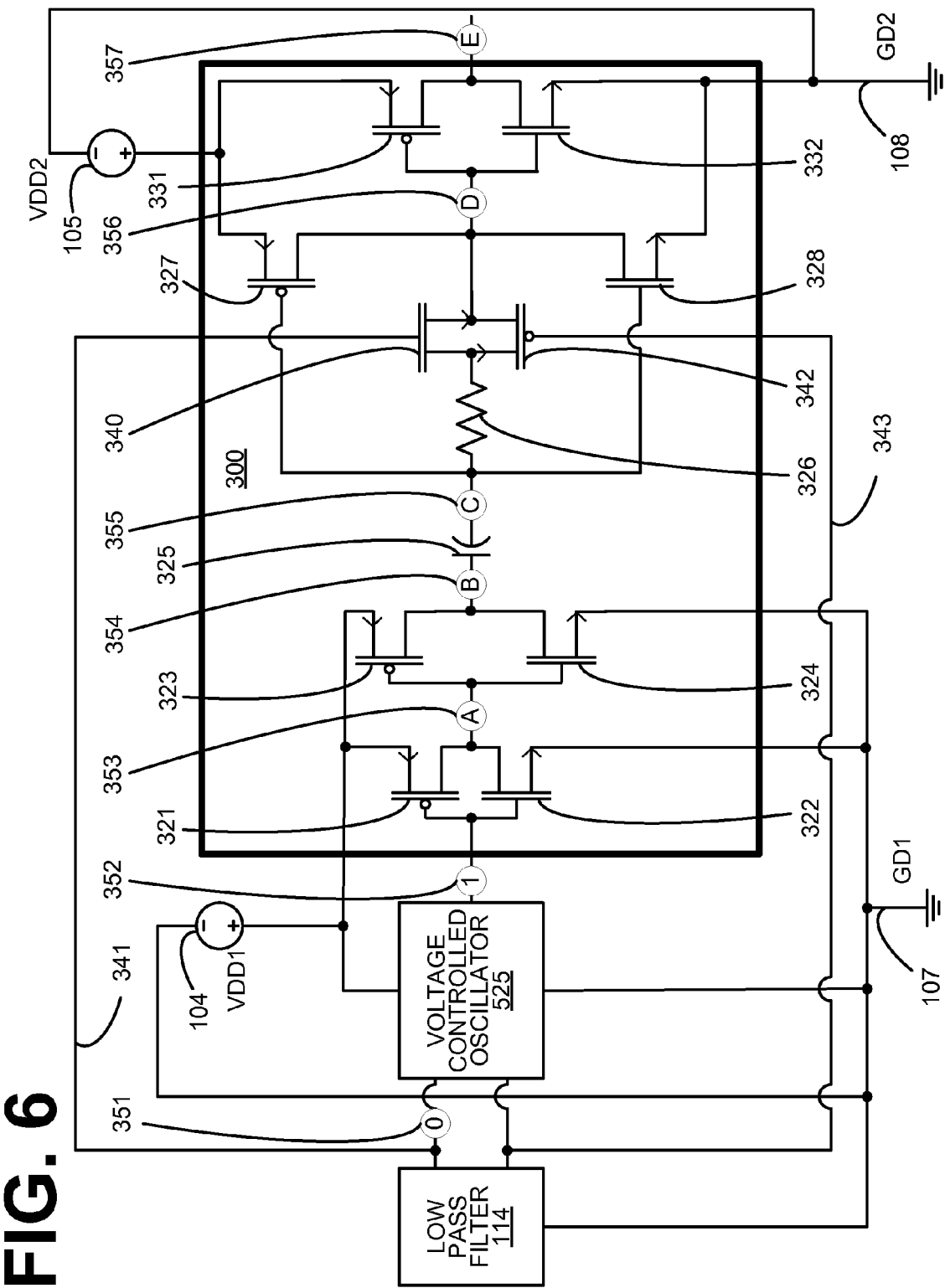
FIG. 6 is a block diagram depicting an example of the architecture of a frequency adaptive level shifter according to one embodiment of the invention, connected to a differential VCO.

FIG. 6 is a block diagram depicting another example of the architecture of a frequency adaptive level shifter 300 according to another embodiment of the invention, connected to a differential VCO 525. This embodiment illustrates the VCO 525 having a differential control. The components in this embodiment, are substantially similar to the components in the embodiment illustrated in FIG. 4, with the addition of pfet 342.

In this case, pfet 342 is placed in parallel with nfet 340, and both of these are placed in series with the feedback resistor 326. The complimentary voltage from the low pass filter 114 is connected to the passgate in the frequency adaptive level shifter 300, the positive side link 341 to the gate node of the nfet 340 and negative side link 343 to the gate node of the pfet 342. The passgate comprising the configuration of the nfet 340 and pfet 342. The remaining circuitry in the frequency adaptive level shifter 300 is connected and operates the same as the corresponding circuitry in the frequency adaptive level shifter 200 illustrated in FIG. 4. In this embodiment, the timing diagram of the operation of a phase-lock loop (PLL) circuit 180 using the frequency adaptive level shifter 300 is identical to the timing diagrams illustrated in FIG. 5.

Figure 7:
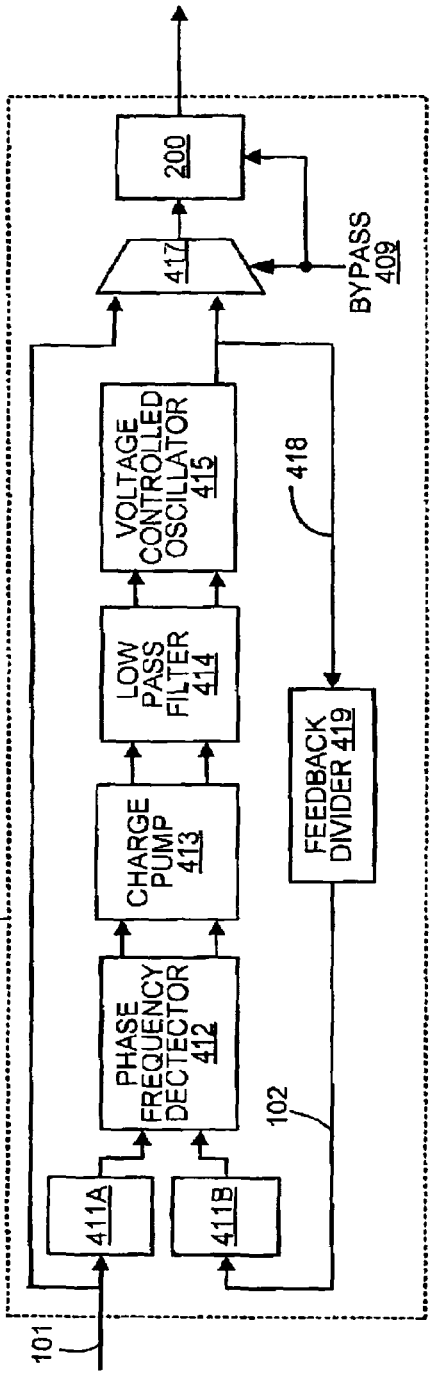
FIG. 7 is a block diagram depicting another example of a phase-lock loop (PLL) circuit with a frequency adaptive level shifter according to another embodiment of the invention.

FIG. 7 is a block diagram depicting another example of the architecture a phase-lock loop (PLL) circuit 400 utilizing a frequency adaptive level shifter 200 according to another embodiment of the invention. The components in this embodiment are substantially similar to the components in the embodiment illustrated in FIG. 1, with the addition of the bypass signal 409 to control the multiplexer 417 output into the frequency adaptive level shifter 200.

In this embodiment, the gate node of the nfet 240 (FIG. 4) is connected to a low voltage source for slow mode and a higher voltage source for fast mode. The select line for the multiplexer 417 connects to the bypass signal 409 of the PLL 400. The bypass signal 409 is generally defined external to the PLL 400. This arrangement is useful where the frequency adaptive level shifter 200 comes directly after a multiplexer 417 that selects either the PLL reference clock 101 (slow) or the VCO output 418 (fast).

Figure 8:
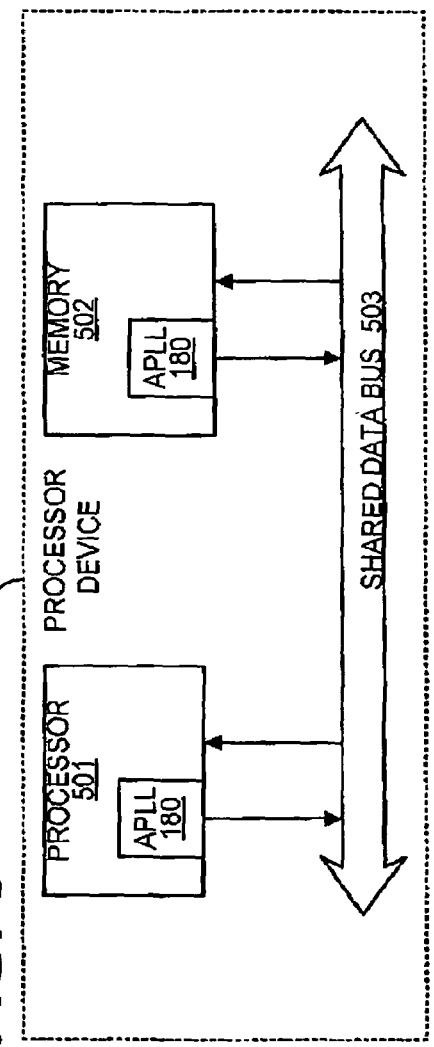
FIG. 8 is a block diagram depicting an example of a processor device incorporating a frequency adaptive level shifter according to one embodiment of the invention.

FIG. 8 is a block diagram depicting an example of a processor device 500 incorporating a frequency adaptive level shifter 180 according to one embodiment of the invention. The frequency adaptive level shifter circuit 200 can be included in a processor device 500. The processor device 500 including a memory 502 containing data, a shared data bus 503 and a processor 501. The processor device 500 further including a phase-lock loop circuitry 180 configured to enable high-speed frequency adaptive level shifting across voltage domain boundaries.

While the invention has been particularly shown and described with reference to specific embodiments thereof, it will be understood by those skilled in the art that changes in the form and details of the disclosed embodiments may be made without departing from the spirit or scope of the invention. For example, the circuits and processes described herein may be represented (without limitation) in software (object code or machine code), in varying stages of compilation, as one or more netlists, in a simulation language, in a hardware description language, by a set of semiconductor processing masks, and as partially or completely realized semiconductor devices. The various alternatives for each of the foregoing as understood by those of skill in the art are also within the scope of the invention. For example, the various types of computer-readable media, software languages (e.g., Verilog, VHDL), simulatable representations (e.g., SPICE netlist), semiconductor processes (e.g., CMOS, GaAs, SiGe, etc.), and device types (e.g., FPGAs) suitable for using in conjunction with the processes described herein are within the scope of the invention.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims

What is claimed is:

1. A phase-lock loop device that generates a frequency adaptive clock signal across voltage domain boundaries comprising:
   a voltage controlled oscillator that receives an analog reference voltage;
   a level shifter that receives a clock signal from the voltage controlled oscillator and the analog reference voltage input to the voltage controlled oscillator and outputs the frequency adaptive clock signal, the level shifter further comprising:
      a first inverter connected to the output of the voltage controlled oscillator;
      a second inverter connected to the output of the first inverter;
      a capacitor connected to the output of the second inverter;
      a variable impedance circuit connected to the output of the capacitor;
      a fourth inverter coupled to the output of the variable impedance circuit; and
   wherein the variable impedance circuit enables the level shifter to be frequency adaptive by making the impedance very high at low voltage on the variable impedance circuit and making the impedance very low at high voltage on the variable impedance circuit.

2. The phase-lock loop device of claim 1, wherein the variable impedance circuit further comprises:
   a resistor connected to the output of the capacitor.

3. The phase-lock loop device of claim 2, wherein the variable impedance circuit further comprises:
   a transistor coupled to the output of the resistor and the transistor has a gate connected to the analog reference voltage that enables the level shifter to be frequency adaptive by making the transistor resistance very high at low voltage on the transistor and making the transistor resistance very low at high voltage on the transistor.

4. The phase-lock loop device of claim 3, wherein the
   a second transistor in parallel with the transistor, wherein the second transistor is coupled to the output of the resistor that has a gate connected to a complimentary analog reference voltage.

5. The phase-lock loop device of claim 3, wherein said first inverter comprises a first nfet and a first pfet that are connected in series between a first supply voltage and a first ground and wherein said second inverter comprises a second nfet and a second pfet that are connected in series between a first supply voltage and a first ground.

6. The phase-lock loop device of claim 5, wherein said third inverter comprises a third nfet and a third pfet that are connected in series between a second supply voltage and a second ground and wherein said fourth inverter comprises a fourth nfet and a fourth pfet that are connected in series between a second supply voltage and a second ground.

7. The phase-lock loop device of claim 6, further comprising:
   a low pass filter coupled to the input of the voltage controlled oscillator;
   a charge pump coupled to the input of the low pass filter; and
   a phase frequency detector that receives a digital clock signal and is coupled to the input of the charge pump.

8. The phase-lock loop device of claim 7, wherein said reference voltage input to the voltage controlled oscillator is proportional to a frequency of a clock signal from the voltage controlled oscillator.

9. The phase-lock loop device of claim 7, wherein the digital clock signal is a slow reference clock and the clock signal from the voltage controlled oscillator is a fast clock signal.

* * * * *